(12) United States Patent
Park et al.

(10) Patent No.: US 10,361,251 B2
(45) Date of Patent: Jul. 23, 2019

(54) IMAGE SENSORS AND ELECTRONIC DEVICES INCLUDING THE SAME

(71) Applicant: Samsung Electronics Co., Ltd., Suwon-si, Gyeonggi-do (KR)

(72) Inventors: Kyung Bae Park, Hwaseong-si (KR); Yong Wan Jin, Seoul (KR); Moon Gyu Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/618,750

(22) Filed: Jun. 9, 2017

(65) Prior Publication Data

US 2017/0278896 A1    Sep. 28, 2017

Related U.S. Application Data

(63) Continuation of application No. 14/596,638, filed on Jan. 14, 2015, now Pat. No. 9,691,823.

(30) Foreign Application Priority Data

Aug. 1, 2014  (KR) ................. 10-2014-0099084

(51) Int. Cl.
*H01L 27/30* (2006.01)
*H01L 27/28* (2006.01)
*H01L 27/146* (2006.01)

(52) U.S. Cl.
CPC ...... *H01L 27/307* (2013.01); *H01L 27/14621* (2013.01); *H01L 27/14647* (2013.01); *H01L 27/286* (2013.01)

(58) Field of Classification Search
CPC ............. H01L 27/14603; H01L 27/307; H01L 27/286
See application file for complete search history.

(56) References Cited

U.S. PATENT DOCUMENTS

| | | | |
|---|---|---|---|
| 5,453,611 A | 9/1995 | Oozu et al. | |
| 6,107,618 A * | 8/2000 | Fossum | H01L 25/167 250/208.1 |
| 8,507,865 B2 | 8/2013 | Boberl et al. | |
| 8,710,418 B2 | 4/2014 | Natori | |
| 2008/0230123 A1 | 9/2008 | Mitsui et al. | |
| 2008/0308149 A1 * | 12/2008 | Nomura | C07D 209/12 136/256 |
| 2009/0293956 A1 | 12/2009 | Kitamura | |
| 2010/0019129 A1 | 1/2010 | Ishigaki et al. | |
| 2010/0123070 A1 | 5/2010 | Natori | |

(Continued)

*Primary Examiner* — Su C Kim
*Assistant Examiner* — David S Wilbert
(74) *Attorney, Agent, or Firm* — Harness, Dickey & Pierce, P.L.C.

(57) ABSTRACT

Image sensors, and electronic devices including the image sensors, include a first photoelectronic device including at least one of a blue photoelectronic device sensing light in a blue wavelength region, a red photoelectronic device sensing light in a red wavelength region, and a green photoelectronic device sensing light in a green wavelength region, and a second photoelectronic device stacked on one side of the first photoelectronic device without being interposed by a color filter, wherein the second photoelectronic device senses light in an infrared region.

12 Claims, 3 Drawing Sheets

(56) References Cited

U.S. PATENT DOCUMENTS

| | | |
|---|---|---|
| 2012/0175636 A1* | 7/2012 | Ihara .................. H01L 27/1461 |
| | | 257/77 |
| 2012/0183452 A1 | 7/2012 | Schalkhammer |
| 2012/0241628 A1 | 9/2012 | Hesser et al. |
| 2013/0001730 A1* | 1/2013 | Miyanami ......... H01L 27/14603 |
| | | 257/443 |
| 2013/0087682 A1 | 4/2013 | Nomura |
| 2015/0171146 A1* | 6/2015 | Ooki ................ H01L 27/14621 |
| | | 250/208.1 |

* cited by examiner

IMAGE SENSORS AND ELECTRONIC DEVICES INCLUDING THE SAME

CROSS-REFERENCE TO RELATED APPLICATIONS

This application is a continuation application of U.S. application Ser. No. 14/596,638 filed on Jan. 14, 2015, which claims priority under 35 U.S.C. § 119 to and the benefit of Korean Patent Application No. 10-2014-0099084 filed in the Korean Intellectual Property Office on Aug. 1, 2014, the entire contents of each of which are incorporated herein by reference.

BACKGROUND

Field

Image sensors and electronic devices including the same are disclosed.

Description of the Related Art

A photoelectronic device converts light into an electrical signal using photoelectronic effects. The photoelectronic device may include a photodiode, a phototransistor, and the like. The photoelectronic device may be applied to an image sensor, a solar cell, and the like.

An image sensor including a photodiode requires a small size and/or high resolution. In order to manufacture an image sensor having a smaller size, a size of a pixel needs to become smaller. However, sensitivity may be deteriorated because an absorption area becomes smaller due to small pixels. In addition, luminance may deteriorate because of low illumination.

SUMMARY

According to example embodiments, image sensors are disclosed.

Other example embodiments provide image sensors that realize down-sizing and high sensitivity and high luminescence characteristics under low illumination.

Further example embodiments provide electronic devices including the image sensors.

According to some example embodiments, an image sensor includes a first photoelectronic device including at least one of a blue photoelectronic device sensing light in a blue wavelength region, a red photoelectronic device sensing light in a red wavelength region, and a green photoelectronic device sensing light in a green wavelength region, and a second photoelectronic device stacked on one side of the first photoelectronic device without being interposed by a color filter, wherein the second photoelectronic device senses light in an infrared region.

The blue wavelength region may have a maximum absorption wavelength ($\lambda_{max}$) at greater than, or equal to, about 400 nm and less than 500 nm, the red wavelength region may have a maximum absorption wavelength ($\lambda_{max}$) at greater than about 580 nm, and less than, or equal to, about 700 nm, the green wavelength region may have a maximum absorption wavelength ($\lambda_{max}$) at about 500 nm to about 580 nm, and the infrared region may have a maximum absorption wavelength ($\lambda_{max}$) at greater than about 700 nm.

The first photoelectronic device may include the blue photoelectronic device, the red photoelectronic device, and the green photoelectronic device, and the blue photoelectronic device, the red photoelectronic device, and the green photoelectronic device may be integrated in a silicon substrate.

The image sensor may further include a color filter layer on the one side of the first photoelectronic device or one side of the second photoelectronic device, wherein the color filter layer includes a blue filter selectively absorbing light in a blue wavelength region, a red filter selectively absorbing light in a red wavelength region, and a green filter selectively absorbing light in a green wavelength region.

The color filter layer may be at a side of the image sensor on which light is incident.

The first photoelectronic device may include an organic photoelectronic device, and the organic photoelectronic device may include a pair of light-transmitting electrodes facing each other and a visible light absorption layer interposed between the pair of light-transmitting electrodes. The visible light absorption layer may selectively absorb light in one of the blue wavelength region, the red wavelength region, and the green wavelength region.

The visible light absorption layer may selectively absorb light in a green wavelength region.

The image sensor may further include a silicon substrate on one side of the organic photoelectronic device, wherein the blue photoelectronic device and the red photoelectronic device may be integrated in the silicon substrate.

The blue photoelectronic device and the red photoelectronic device may be spaced apart from each other in a horizontal direction.

The image sensor may further include a color filter layer between the organic photoelectronic device and the silicon substrate, wherein the color filter layer includes a blue filter selectively absorbing light in a blue wavelength region and a red filter selectively absorbing light in a red wavelength region.

The blue photoelectronic device and the red photoelectronic device may be stacked in a vertical direction, and the red photoelectronic device may be positioned further from a surface of the silicon substrate than the blue photoelectronic device.

The second photoelectronic device may include a pair of light-transmitting electrodes facing each other, and an infrared light absorption layer interposed between the pair of light-transmitting electrodes. The infrared light absorption layer may selectively absorb light in an infrared region.

The infrared light absorption layer may include at least one selected from a quinoid metal complex compound, a cyanine compound, an immonium compound, a diimmonium compound, a triarylmethane compound, a dipyrromethene compound, diquinone compound, a naphthoquinone compound, an anthraquinone compound, a squarylium compound, a rylene compound, a phthalocyanine compound, naphthalocyanine compound, a perylene compound, an anthraquinone compound, a nickel-dithiol complex compound, and a derivative thereof.

The first photoelectronic device and the second photoelectronic device may contact each other, or a transparent insulator may be interposed between the first photoelectric device and the second photoelectronic device.

According to further example embodiments, an electronic device including the image sensor is provided.

The electronic device may be a mobile phone, a digital camera, or a bio-sensing camera.

BRIEF DESCRIPTION OF THE DRAWINGS

Example embodiments will be more clearly understood from the following detailed description taken in conjunction with the accompanying drawings.

FIG. 1 is a cross-sectional view of an image sensor according some example embodiments, FIG. 2 is a cross-sectional view of an image sensor according to other example embodiments, and FIG. 3 is a cross-sectional view of an image sensor according to further example embodiments.

DETAILED DESCRIPTION

Figure 1:
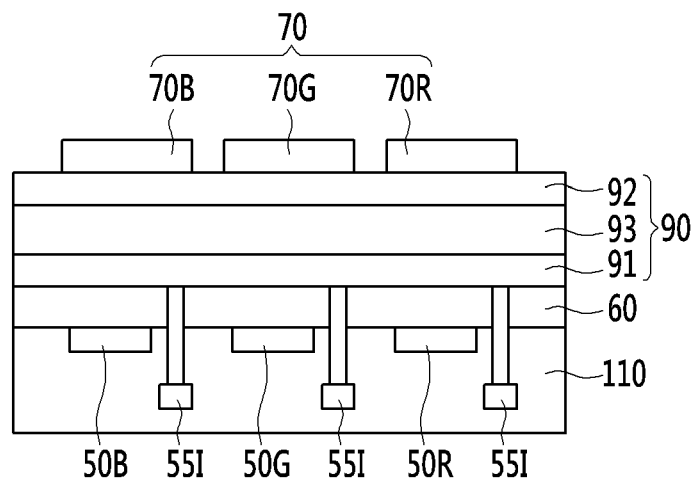
FIGS. 1-3 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Hereinafter, an image sensor according to example embodiments is described. Herein, a CMOS image sensor as an example of an image sensor is described. However, example embodiments are not limited thereto.

An image sensor according to some example embodiments includes a first photoelectronic device sensing light in a visible light region and a second photoelectronic device sensing light in an infrared region.

The first photoelectronic device may sense light in a visible light region, and may include at least one of a blue photoelectronic device sensing light in a blue wavelength region, a red photoelectronic device sensing light in a red wavelength region, and a green photoelectronic device sensing light in a green wavelength region. Herein, the blue wavelength region may have a maximum absorption wavelength ($\lambda_{max}$) at greater than, or equal to, about 400 nm and less than 500 nm, the red wavelength region may have a maximum absorption wavelength ($\lambda_{max}$) at greater than about 580 nm and less than or equal to about 700 nm, and the green wavelength region may have a maximum absorption wavelength ($\lambda_{max}$) at about 500 nm to about 580 nm.

The second photoelectronic device may sense light in an infrared region, wherein the infrared region may include, for example, a near-infrared ray region, a mid-infrared region, and a far-infrared region. For example, the infrared region may have a maximum absorption wavelength ($\lambda_{max}$) at greater than about 700 nm. The infrared region may have, for example, a maximum absorption wavelength ($\lambda_{max}$) of greater than about 700 nm and less than or equal to about 3 µm.

The first photoelectronic device and the second photoelectronic device may be stacked, and the first photoelectronic device may be positioned at a light incidence side or the second photoelectronic device may be positioned at a light incidence side. The first photoelectronic device and the second photoelectronic device may contact each other, or may be interposed by a transparent insulator. The first photoelectronic device and the second photoelectronic device are not interposed by a color filter.

FIG. 1 is a cross-sectional view of an image sensor according to some example embodiments.

Referring to FIG. 1, an image sensor according to some example embodiments include a semiconductor substrate 110 integrated with a first photoelectronic device including a blue photoelectronic device 50B, a red photoelectronic device 50R, and a green photoelectronic device 50G, a lower insulation layer 60, a second photoelectronic device 90, and a color filter layer 70.

The semiconductor substrate 110 may be a silicon substrate, and is integrated with the blue photoelectronic device 50B, the red photoelectronic device 50R, the green photoelectronic device 50G, charge storage units 55I, and transmission transistors (not shown). The blue photoelectronic device 50B, the red photoelectronic device 50R, and the green photoelectronic device 50G may be photodiodes. The blue photoelectronic device 50B and a first transmission transistor may be integrated in each blue pixel, the red photoelectronic device 50R and a second transmission transistor may be integrated in each red pixel, and the green photoelectronic device 50G and a third transmission transistor may be integrated in each green pixel. The charge storage units 55I are electrically connected to the second photoelectronic device 90.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but is not limited thereto. However, example embodiments are not limited to the structure, and the metal wire and pad may be positioned under the blue photoelectronic device 50B, the red photoelectronic device 50R, and the green photoelectronic device 50G.

The lower insulation layer 60 is formed on the semiconductor substrate 110. The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench exposing the photoelectronic devices 50B, 50R, and 50G and the charge storage unit 55I of each pixel. The trench may be filled with fillers. The lower insulation layer 60 may be omitted.

The second photoelectronic device 90 is formed on the lower insulation layer 60.

The second photoelectronic device 90 includes a lower electrode 91 and an upper electrode 92 facing each other, and an infrared light absorption layer 93 interposed between the lower electrode 91 and the upper electrode 92.

One of the lower electrode 91 and the upper electrode 92 is an anode and the other is a cathode. The lower electrode 91 and the upper electrode 92 may be light-transmitting electrodes. The light-transmitting electrodes may be made of, for example, a transparent conductor such as indium tin oxide (ITO) or indium zinc oxide (IZO), or may be metal thin layers having a thin thickness of several nanometers or several tens of nanometers or metal thin layers having a thin thickness of several nanometers to several tens of nanometers doped with a metal oxide.

The infrared light absorption layer 93 may include a material selectively absorbing light in an infrared region. The infrared light absorption layer 93 may include a p-type and an n-type semiconductor. At least one of the p-type semiconductor and the n-type semiconductor may be a material selectively absorbing light in an infrared region, for example, a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylene compound, a phthalocyanine compound, a naphthalocyanine compound, a perylene compound, an anthraquinone compound, a nickel-dithiol complex compound, a derivative thereof, or a combination thereof, but example embodiments are not limited thereto.

The infrared light absorption layer 93 may have a thickness of about 1 nm to about 500 nm. Within the range, the infrared light absorption layer 93 may have a thickness of about 5 nm to about 300 nm. When the infrared light absorption layer 93 has a thickness within the range, the infrared light absorption layer 93 may effectively absorb light in an infrared region, effectively separate holes from electrons, and allow the separated holes and electrons to migrate, effectively improving photoelectric conversion efficiency.

The second photoelectronic device 90 may produce excitons inside the image sensor device when light enters from the upper electrode 92, and the infrared light absorption layer 93 selectively absorbs light in the infrared ray wavelength region. Excitons are separated into holes and electrons in the infrared light absorption layer 93, and the separated holes are moved to the anode side, which is one of the lower electrode 91 and the upper electrode 92, and the separated electrons are moved to a cathode which is the other of the lower electrode 91 and the upper electrode 92, so as to allow a current to flow. The separated electrons or holes may be collected in the charge storage units 55I.

The second photoelectronic device 90 selectively absorbs light in an infrared region, and transmits light in other wavelength regions besides the infrared region.

The color filter layer 70 includes a blue filter 70B selectively absorbing light in a blue wavelength region, a red filter 70R selectively absorbing light in a red wavelength region, and a green filter 70G selectively absorbing light in a green wavelength region. The blue filter 70B, the red filter 70R, and the green filter 70G may be respectively positioned in the blue pixel, the red pixel, and the green pixel. The blue filter 70B absorbs light in a blue wavelength region and transfers it to the blue photoelectronic device 50B, the red filter 70R absorbs light in a red wavelength region and transfers it to the red photoelectronic device 50R, and the green filter 70G absorbs light in a green wavelength region and transfers it to the green photoelectronic device 50G. The color filter layer 70 may transmit light in an infrared region.

A focusing lens (not shown) may be further formed on the color filter layer 70. The focusing lens may control a direction of incident light and gather the light in one region. The focusing lens may have a shape of, for example, a cylinder or a hemisphere, but is not limited thereto.

In FIG. 1, the second photoelectronic device 90 is stacked on the semiconductor substrate 110, but example embodiments are not limited thereto, and the semiconductor substrate 110 may be stacked on the second photoelectronic device 90.

As described above, the image sensor according to the present example embodiments includes the first photoelectronic device sensing light in a visible light region and the second photo electronic device sensing light in an infrared region that are stacked in a vertical direction, and thereby features of the first photoelectronic device and the second photoelectronic device may be maintained without increasing an area of the image sensor. Particularly, sensitivity and luminance of the image sensor may be prevented from abruptly decreasing under low illumination environments of, for example, less than about 11 lux, and high sensitivity and high luminescence characteristics may be realized due to the second photoelectronic device sensing light in an infrared region.

The image sensor according to the present example embodiments includes the color filter layer 70 positioned at the light incidence side, and thereby, a part of visible light may be absorbed and/or reflected by the light-transmitting electrode of the second photoelectronic device 90 and thus visible light transmittance may be prevented from decreasing, compared with a structure where the second photoelectronic device 90 is disposed on the color filter layer 70. Therefore, transmittance of visible light to the first photoelectronic device may be prevented from decreasing and efficiency caused thereby may be prevented from decreasing.

The image sensor according to the present example embodiments includes the color filter layer 70 positioned at the light incidence side, and thereby, areas of the color filters 70B, 70R, and 70G for absorbing light and an aperture ratio of each pixel increase and sensitivity is improved, compared with a structure where the second photoelectronic device 90 is disposed on the color filter layer 70. When the second photoelectronic device 90 is disposed on the color filter layer 70, an aperture ratio of each pixel decreases and thus sensitivity may be deteriorated by decreasing areas of the color filters 70B, 70R, and 70G in order to form spaces of trenches connecting the second photoelectronic device 90 and the charge storage units 55I.

Figure 2:
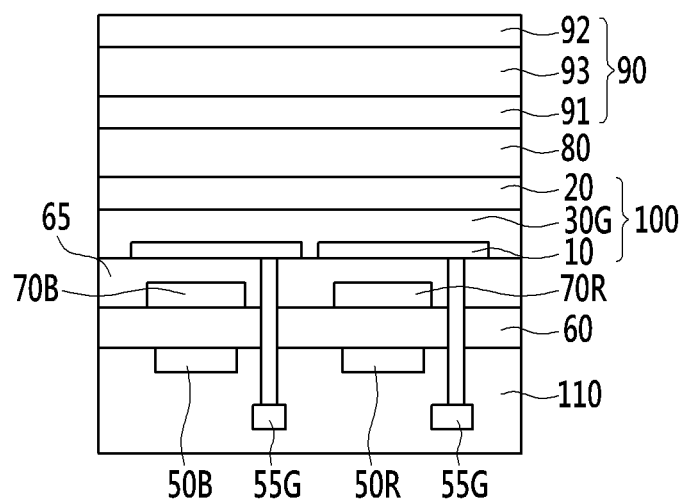

FIG. 2 is a cross-sectional view of an image sensor according to other example embodiments.

Referring to FIG. 2, an image sensor according to other example embodiments includes a semiconductor substrate 110 including a blue photoelectronic device 50B and a red photoelectronic device 50R, a lower insulation layer 60, color filters 70B and 70R, an intermediate insulation layer 65, an organic photoelectronic device 100, an upper insulation layer 80, and a second photoelectronic device 90.

The semiconductor substrate 110 may be a silicon substrate, and is integrated with the blue photoelectronic device 50B, the red photoelectronic device 50R, charge storage units 55G, and transmission transistors (not shown). The blue photoelectronic device 50B and red photoelectronic device 50R may be photodiodes. The blue photoelectronic device 50B and the red photoelectronic device 50R may be spaced apart from each other in a horizontal direction. The blue photoelectronic device 50B and the respective transmission transistor may be integrated in each blue pixel, the red photoelectronic device 50R and the respective transmission transistor may be integrated in each red pixel, and the respective charge storage unit 55G may be electrically connected with the organic photoelectronic device 100.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but is not limited thereto. However, example embodiments are not limited to the structure, and the metal wire and pad may be positioned under the blue photoelectronic device 50B and the red photoelectronic device 50R.

The lower insulation layer 60 is formed on the semiconductor substrate 110. The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench exposing the photoelectronic devices 50B, 50R, and 50G and the charge storage unit 55G of each pixel. The trench may be filled with fillers.

The color filter layers 70B and 70R are formed on the lower insulation layer 60. The color filter layers 70B and 70R include the blue filter 70B formed in the blue pixel and the red filter 70R filled in the red pixel. The color filter 70B of the blue pixel absorbs light in a blue wavelength region and transfers it to the blue photoelectronic device 50B, and the color filter 70R of the red pixel absorbs light in a red wavelength region and transfers it to the red photoelectronic device 50R.

The intermediate insulation layer 65 is formed on the color filter layers 70B and 70R. The intermediate insulation layer 65 eliminates a step caused by the color filter layers 70B and 70R and smoothes the surface. The intermediate insulation layer 65 and the lower insulation layer 60 may include a contact hole (not shown) exposing a pad, and a trench exposing the charge storage unit 55G of a green pixel.

The organic optoelectronic device 100 is formed on the intermediate insulation layer 65. The organic photoelectronic device 100 may selectively sense light in a green wavelength region.

The organic photoelectronic device 100 includes a lower electrode 10 and an upper electrode 20, and a green light absorption layer 30G interposed between the lower electrode 10 and the upper electrode 20. One of the lower electrode 10 and the upper electrode 20 is an anode and the other is a cathode.

The lower electrode 10 and the upper electrode 20 may be light-transmitting electrodes, and the light-transmitting electrodes may be made of, for example, a transparent conductor such as indium tin oxide (ITO) or indium zinc oxide (IZO), or may be metal thin layers having a thin thickness of several nanometers or several tens of nanometers or metal thin layers having a thin thickness of several nanometers to several tens of nanometers doped with a metal oxide.

The green light absorption layer 30G selectively absorbs light in a green wavelength region, and transmits light in other wavelength regions besides the green wavelength region, that is, light in a blue wavelength region and a red wavelength region.

The green light absorption layer 30G may include a p-type semiconductor and an n-type semiconductor, and the p-type semiconductor and the n-type semiconductor may form a pn junction. At least one of the p-type semiconductor and the n-type semiconductor may selectively absorb light in a green wavelength region, and may selectively absorb light in a green wavelength region to generate excitons, and then the generated excitons may be separated into holes and electrons to provide a photoelectric effect. The green light absorption layer 30G may replace a green filter.

Each of the p-type semiconductor and the n-type semiconductor may have an energy bandgap of, for example, about 2.0 eV to about 2.5 eV, and the p-type semiconductor and the n-type semiconductor may have a LUMO difference of, for example, about 0.2 eV to about 0.7 eV.

The p-type semiconductor material may be, for example, quinacridone or a derivative thereof, or sub-phthalocyanine or a derivative thereof, and the n-type semiconductor material may be, for example, a cyanovinyl group-containing thiophene derivative, fullerene, or a fullerene derivative, but are not limited thereto.

The green light absorption layer 30G may be a single layer or a multilayer. The green light absorption layer 30G may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a thickness ratio of about 1:100 to about 100:1. The compounds may be included in a thickness ratio ranging from about 1:50 to about 50:1 within the range, specifically, about 1:10 to about 10:1, and more specifically, about 1 to about 1. When the p-type and n-type semiconductors have a composition ratio within the range, an exciton may be effectively produced, and a pn junction may be effectively formed.

The p-type layer may include the p-type semiconductor, and the n-type layer may include the n-type semiconductor.

The green light absorption layer 30G may have a thickness of about 1 nm to about 500 nm. Within the range, the green light absorption layer 30G may have a thickness of about 5 nm to about 300 nm. When the green light absorption layer 30G has a thickness within the range, the active layer may effectively absorb light, effectively separate holes from electrons, and deliver them, effectively improving photoelectric conversion efficiency.

The organic photoelectronic device 100 may produce excitons on the inside when light enters from the upper electrode 20 and the green light absorption layer 30G selectively absorbs light in a green wavelength region. Excitons are separated into holes and electrons in the green light absorption layer 30G, and the separated holes are moved to the anode side, which is one of the lower electrode 10 and the upper electrode 20, and the separated electrons are moved to a cathode side, which is the other of the lower electrode 10 and the upper electrode 20, so as to allow a current to flow. The separated electrons or holes may be collected in the charge storage unit 55G. The light in other wavelength regions except the green wavelength region may be transmitted to the lower electrode 10 and the color filters 70B and 70R, and may be sensed by the blue photoelectronic device 50B or the red photoelectronic device 50R.

The green light absorption layer 30G may be formed on the front side of the image sensor, and thus light may be absorbed at the front side and the light area may be increased to have high light absorption efficiency.

The blue photoelectronic device 50B, and the red photoelectronic device 50R, integrated in the semiconductor substrate 110, and the organic photoelectronic device 100 including the green light absorption layer 30G, may provide the first photoelectronic device.

The upper insulation layer 80 is formed on the organic photoelectronic device 100.

The upper insulation layer 80 may be, for example, made of an inorganic insulating material such as a silicon oxide and/or a silicon nitride, or a low dielectric constant (low K) material such as SiC, SiCOH, SiCO, and SiOF. The upper insulation layer 80 may be omitted.

The second photoelectronic device 90 is formed on the upper insulation layer 80.

The second photoelectronic device 90 includes the lower electrode 91 and the upper electrode 92 facing each other, and the infrared light absorption layer 93 interposed between the lower electrode 91 and the upper electrode 92.

One of the lower electrode 91 and the upper electrode 92 is an anode and the other is a cathode. The lower electrode 91 and the upper electrode 92 may be light-transmitting electrodes, and the light-transmitting electrodes may be made of, for example, a transparent conductor such as indium tin oxide (ITO) or indium zinc oxide (IZO), or may be metal thin layers having a thin thickness of several nanometers or several tens of nanometers or metal thin layers having a thin thickness of several nanometers to several tens of nanometers doped with a metal oxide.

The infrared light absorption layer 93 may include a material selectively absorbing light in an infrared region. The infrared light absorption layer 93 may include a p-type and an n-type semiconductor, and at least one of the p-type semiconductor and the n-type semiconductor may be a material selectively absorbing light in an infrared region, for example a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylene compound, a phthalocyanine compound, a naphthalocyanine compound, a perylene compound, an anthraquinone compound, a nickel-dithiol complex compound, a derivative thereof, or a combination thereof, but example embodiments are not limited thereto.

The infrared light absorption layer 93 may have a thickness of about 1 nm to about 500 nm. Within the range, the infrared light absorption layer 93 may have a thickness of about 5 nm to about 300 nm. When the infrared light absorption layer 93 has a thickness within the range, the infrared light absorption layer 93 may effectively absorb light in an infrared region, effectively separate holes from electrons, and deliver them, effectively improving photoelectric conversion efficiency.

The second photoelectronic device 90 may produce excitons on the inside when light enters from the upper electrode 92, and the infrared light absorption layer 93 selectively absorbs light in the infrared ray wavelength region. Excitons are separated into holes and electrons in the infrared light absorption layer 93, and the separated holes are moved to the anode side, which is one of the lower electrode 91 and the upper electrode 92, and the separated electrons are moved to the cathode side, which is the other of the lower electrode 91 and the upper electrode 92, so as to flow a current. The separated electrons or holes may be collected in a charge storage unit (not shown).

The second photoelectronic device 90 selectively absorbs light in an infrared region, and transmits light in other wavelength regions besides the infrared region.

A focusing lens (not shown) may be further formed on the second photoelectronic device 90. The focusing lens may control a direction of incident light and gather the light in one region. The focusing lens may have a shape of, for example, a cylinder or a hemisphere, but example embodiments are not limited thereto.

In FIG. 2, the second photoelectronic device 90 is stacked on the organic photoelectronic device 100, but example embodiments are not limited thereto, and the organic photoelectronic device 100 may be stacked on the second photoelectronic device 90.

In FIG. 2, the blue photoelectronic device 50B and the red photoelectronic device 50R are integrated in the semiconductor substrate 110, and the organic photoelectronic device 100 includes the green light absorption layer 30G, but example embodiments are not limited thereto. That is, the blue photoelectronic device and the green photoelectronic device may be integrated in the semiconductor substrate 110 and the organic photoelectronic device 100 may include a red light absorption layer, or the red photoelectronic device and the green photoelectronic device may be integrated in the semiconductor substrate 110 and the organic photoelectronic device 100 may include a blue light absorption layer.

The image sensor according to the present example embodiments includes the first photoelectronic device sensing light in a visible light region and the second photoelectronic device sensing light in an infrared region and that are stacked in a vertical direction, and thereby features of the first photoelectronic device and the second photoelectronic device may be maintained without increasing an area of the image sensor. Particularly, sensitivity and luminance of the image sensor may be prevented from abruptly decreasing under low illumination environments of, for example, less than about 11 lux, and high sensitivity and high luminescence characteristics may be realized due to the second photoelectronic device sensing light in an infrared region.

The image sensor according to the present example embodiments includes a color filter layer adsorbing light in a blue wavelength region and light in a red wavelength region as a first photoelectronic device, and a green photoelectronic device absorbing light in a green wavelength region, which are stacked in a vertical direction, and thereby an area of an image sensor may be decreased and downsizing of an image sensor may be realized. The photoelectronic device selectively absorbing light in a green wavelength region may be formed on a front side of an image sensor, and increases an area absorbing light and ensures an area of a color filter layer resulting in improvement of light absorption efficiency.

Figure 3:
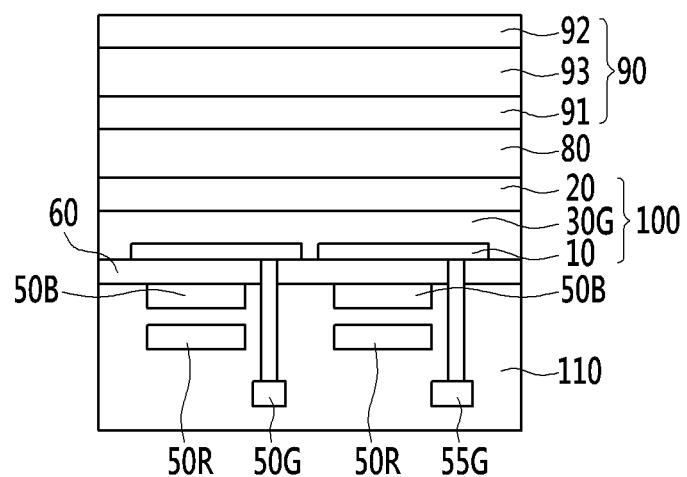

FIG. 3 is a cross-sectional view of an image sensor according to further example embodiments.

Referring to FIG. 3, an image sensor according to further example embodiments includes a semiconductor substrate 110 including a blue photoelectronic device 50B and a red photoelectronic device 50R, a lower insulation layer 60, an organic photoelectronic device 100, an upper insulation layer 80, and a second photoelectronic device 90, like the above example embodiments.

The semiconductor substrate 110 may be a silicon substrate, and is integrated with the blue photoelectronic device 50B, the red photoelectronic device 50R, a charge storage unit 55G, and a transmission transistor (not shown). The blue photoelectronic device 50B and the red photoelectronic device 50R may be photodiodes.

However, the image sensor according to the present example embodiments may include the blue photoelectronic device 50B and the red photoelectronic device 50R stacked in a vertical direction, unlike the above example embodiments. The blue photoelectronic device 50B and the red photoelectronic device 50R are electrically connected to charge storage units (not shown), and the information sensed by the photoelectronic devices may be transferred by a respective transmission transistor. The blue photoelectronic device 50B and the red photoelectronic device 50R may selectively absorb light in each wavelength region depending on a stack depth.

A metal wire (not shown) and a pad (not shown) are formed on the semiconductor substrate 110. In order to decrease signal delay, the metal wire and the pad may be made of a metal having low resistivity, for example, aluminum (Al), copper (Cu), silver (Ag), and alloys thereof, but example embodiments are not limited thereto. Further, example embodiments are not limited to the above-described structure, and the metal wire and pad may be positioned under the blue photoelectronic device 50B and the red photoelectronic device 50R.

The lower insulation layer 60 is formed on the semiconductor substrate 110. The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench exposing the photoelectronic devices 50B and 50R and the charge storage 55G of each pixel. The trench may be filled with fillers.

The organic photoelectronic device 100 is formed on the lower insulation layer 60. The organic photoelectronic device 100 may selectively sense light in a green wavelength region.

The organic photoelectronic device 100 includes a lower electrode 10 and an upper electrode 20 facing each other, and a green light absorption layer 30G interposed between the lower electrode 10 and the upper electrode 20. One of the lower electrode 10 and the upper electrode 20 is an anode and the other is a cathode.

The lower electrode 10 and the upper electrode 20 may be light-transmitting electrodes, and the light-transmitting electrodes may be made of, for example, a transparent conductor such as indium tin oxide (ITO) or indium zinc oxide (IZO), or may be metal thin layers having a thin thickness of several nanometers or several tens of nanometers or metal thin layers having a thin thickness of several nanometers to several tens of nanometers doped with a metal oxide.

The green light absorption layer 30G selectively absorbs light in a green wavelength region and transmits light in other wavelength regions besides the green wavelength region, that is a blue wavelength region and a red wavelength region.

The green light absorption layer 30G may include, for example, a p-type semiconductor and an n-type semiconductor, and the p-type semiconductor and the n-type semiconductor may form a pn junction. At least one of the p-type semiconductor and the n-type semiconductor may selectively absorb light in a green wavelength region, and may selectively absorb light in a green wavelength region to generate excitons, and then the generated excitons may be separated into holes and electrons to provide a photoelectric effect. The green light absorption layer 30G may replace a green filter.

The green light absorption layer 30G may be formed on the front side of the image sensor, and thus light may be absorbed at the front side and the light area may be increased to have high light absorption efficiency.

The organic photoelectronic device 100 including the blue photoelectronic device 50B, the red photoelectronic device 50R, and the green light absorption layer 30G integrated in the semiconductor substrate 110 may provide the first photoelectronic device.

The upper insulation layer 80 is formed on the organic photoelectronic device 100.

The upper insulation layer 80 may be, for example, made of an inorganic insulating material such as a silicon oxide and/or a silicon nitride, or a low dielectric constant (low K) material such as SiC, SiCOH, SiCO, and SiOF. The upper insulation layer 80 may be omitted.

The second photoelectronic device 90 is formed on the upper insulation layer 80.

The second photoelectronic device 90 includes a lower electrode 91 and an upper electrode 92 facing each other, and an infrared light absorption layer 93 interposed between the lower electrode 91 and the upper electrode 92.

One of the lower electrode 91 and the upper electrode 92 is an anode and the other is a cathode. The lower electrode 91 and the upper electrode 92 may be light-transmitting electrodes, and the light-transmitting electrodes may be made of, for example, a transparent conductor such as indium tin oxide (ITO) or indium zinc oxide (IZO), or may be metal thin layers having a thin thickness of several nanometers or several tens of nanometers or metal thin layers having a thin thickness of several nanometers to several tens of nanometers doped with a metal oxide.

The infrared light absorption layer 93 may include a material selectively absorbing light in an infrared region. The infrared light absorption layer 93 may include a p-type and n-type semiconductor, and at least one of the p-type semiconductor and the n-type semiconductor may be a material selectively absorbing light in an infrared region, for example a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylene compound, a phthalocyanine compound, a naphthalocyanine compound, a perylene compound, an anthraquinone compound, a nickel-dithiol complex compound, a derivative thereof, or a combination thereof, but example embodiments are not limited thereto.

The infrared light absorption layer 93 may have a thickness of about 1 nm to about 500 nm. Within the range, the infrared light absorption layer 93 may have a thickness of about 5 nm to about 300 nm. When the infrared light absorption layer 93 has a thickness within the range, the infrared light absorption layer 93 may effectively absorb light in an infrared region, effectively separate holes from electrons, and allow the separated holes and electrons to migrate, effectively improving photoelectric conversion efficiency.

The second photoelectronic device 90 selectively absorbs light in an infrared region, and transmits light in other wavelength regions besides the infrared region.

A focusing lens (not shown) may be further formed on the second photoelectronic device 90. The focusing lens may control a direction of incident light and gather the light in one region. The focusing lens may have a shape of, for example, a cylinder or a hemisphere, but example embodiments are not limited thereto.

In FIG. 3, the second photoelectronic device 90 is stacked on the organic photoelectronic device 100 but example embodiments are not limited thereto, and the organic photoelectronic device 100 may be stacked on the second photoelectronic device 90.

In FIG. 3, the blue photoelectronic device 50B and the red photoelectronic device 50R are integrated in the semiconductor substrate 110, and the organic photoelectronic device 100 includes the green light absorption layer 30G, but example embodiments are not limited thereto. The blue photoelectronic device and the green photoelectronic device may be integrated in the semiconductor substrate 110 and the organic photoelectronic device 100 may include a red light absorption layer. Herein, the green photoelectronic device may be positioned under the blue photoelectronic device. Likewise, the red photoelectronic device and the green photoelectronic device may be integrated in the semiconductor substrate 110 in a vertical direction, and the organic photoelectronic device 100 may include a blue light absorption layer. Herein, the red photoelectronic device may be positioned under the green photoelectronic device.

Figure 4:
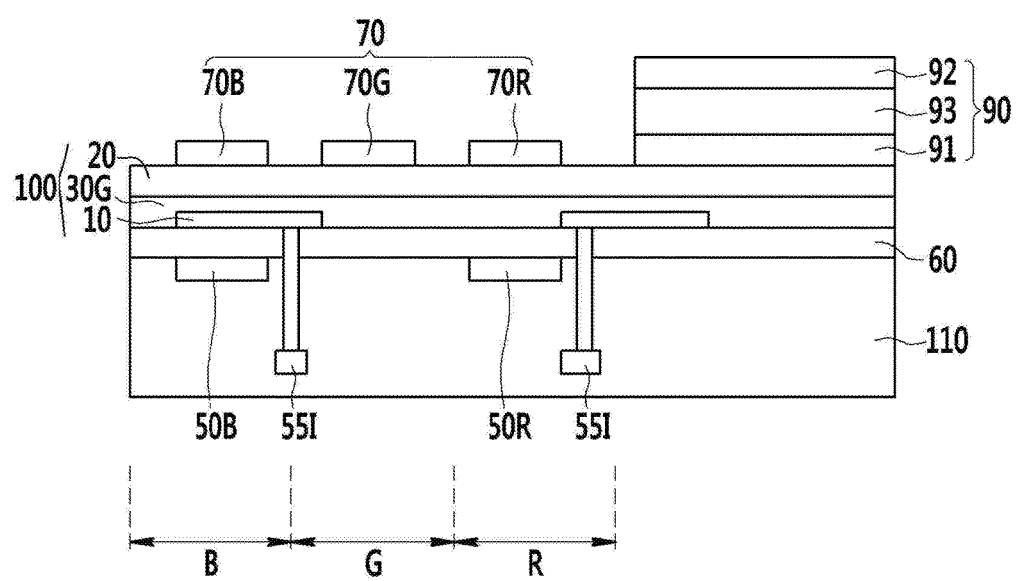
FIG. 4 is a cross-sectional view of an image sensor according to further example embodiments.

FIG. 4 is a cross-sectional view of an image sensor according to further example embodiments.

Referring to FIG. 4, an image sensor according to further example embodiments includes a color filter 70 and the second photoelectronic device 90, positioned on a same surface of an organic photoelectronic device 100, without the color filter 70 being interposed between the organic photoelectronic device 100 and second photoelectronic device 90. An upper insulator 80 may optionally be interposed between the color filter 70 and the organic photoelectronic device 100 and/or between the second photoelectronic device 90 and the organic photoelectronic device 100.

The image sensor according to the present example embodiments includes the first photoelectronic device sensing light in a visible light region, and the second photoelectronic device sensing light in an infrared region and that are stacked in a vertical direction, and thereby features of the first photoelectronic device and the second photoelectronic device may be maintained without increasing an area of the image sensor. Particularly, sensitivity and luminance of the image sensor may be prevented from abruptly decreasing under low illumination environments of, for example, less than about 11 lux, and high sensitivity and high luminescence characteristics may be realized due to the second photoelectronic device sensing light in an infrared region.

The image sensor according to the present example embodiments includes a red photoelectronic device and a blue photoelectronic device as well as an organic photoelectronic device selectively absorbing light in a green wavelength region and has a stack structure in a vertical direction, and thereby an area of an image sensor may be decreased and down-sizing of an image sensor may be realized. The photoelectronic device selectively absorbing light in a green wavelength region may be formed on a front side of an image sensor, and increases an area absorbing light and ensures an area of a color filter layer resulting in improvement of light absorption efficiency.

The image sensor according to the present example embodiments may simplify a structure and a process by not including a color filter layer.

The image sensor may be applied to various electronic devices, for example a mobile phone, a digital camera, a biosensor, and the like, but example embodiments are not limited thereto.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 50B: blue photoelectronic device | 50R: red photoelectronic device |
| 55G, 55I: charge storage | 60: lower insulation layer |
| 65: intermediate insulation layer | 70: color filter layer |
| 80: upper insulation layer | 90: second photoelectronic device |
| 10, 91: lower electrode | 20, 92: upper electrode |
| 30G: green light absorption layer | 93: infrared light absorption layer |
| 110: semiconductor substrate | |

What is claimed is:

1. An image sensor, comprising:
a first photoelectronic device configured to sense light in a first visible wavelength region; and
a second photoelectronic device stacked in a vertical direction on the first photoelectronic device, the second photoelectronic device closer to a light incidence side than the first photoelectronic device, the second photoelectronic device covering a limited portion of the first photoelectronic device, the second photoelectronic device configured to sense light in an infrared wavelength region;
at least one third photoelectronic device configured to sense light in a second visible wavelength region, the first photoelectronic device between the at least one third photoelectronic device and the second photoelectronic device, the first photoelectronic device vertically overlapping an entirety of the at least one third photoelectronic device; and
at least one color filter on the at least one third photoelectronic device, the at least one color filter configured to selectively absorb light in a wavelength region that is separate from the second visible wavelength region,
wherein the second photoelectronic device and the first photoelectronic device are stacked in the vertical direction with the second photoelectronic device being at a height above the first photoelectronic device.

2. The image sensor of claim 1, wherein,
the first photoelectronic device includes an organic photoelectronic device,
the organic photoelectronic device includes a pair of light-transmitting electrodes and a visible light absorption layer between the pair of light-transmitting electrodes, and
the visible light absorption layer is configured to selectively absorb light in the first visible wavelength region.

3. The image sensor of claim 1, wherein,
the at least one third photoelectronic device is laterally offset in relation to the second photoelectronic device, such that the at least one third photoelectronic device is exposed from the second photoelectronic device.

4. The image sensor of claim 1, wherein,
the first photoelectronic device is between the at least one color filter and the at least one third photoelectronic device.

5. The image sensor of claim 4, wherein,
the at least one color filter and the second photoelectronic device are on a common surface of the first photoelectronic device.

6. The image sensor of claim 5, wherein
the at least one third photoelectronic device includes a plurality of third photoelectronic devices, each third photoelectronic device of the plurality of third photoelectronic devices configured to sense a different second visible wavelength region, each second visible wavelength being separate from the first visible wavelength region, and
the at least one color filter includes a plurality of color filters on the common surface of the first photoelectronic device, each color filter of the plurality of color filters configured to selectively absorb light in a different wavelength region, at least two color filters of the plurality of color filters overlapping separate, respective third photoelectronic devices of the plurality of third photoelectronic devices.

7. The image sensor of claim 1, further comprising:
a silicon substrate on one side of the first photoelectronic device,
wherein the at least one third photoelectronic device is integrated in the silicon substrate.

8. The image sensor of claim 1, further comprising:
a fourth photoelectronic device configured to sense light in a third visible wavelength region, the at least one third photoelectronic device between the first photoelectronic device and the fourth photoelectronic device.

9. The image sensor of claim 1, wherein
the second photoelectronic device includes a pair of light-transmitting electrodes and an infrared light absorption layer between the pair of light-transmitting electrodes, and
the infrared light absorption layer selectively absorbs light in an infrared region.

10. The image sensor of claim 9, wherein the infrared light absorption layer includes at least one selected from a quinoid metal complex compound, a cyanine compound, an immonium compound, a diimmonium compound, a triarylmethane compound, a dipyrromethene compound, diquinone compound, a naphthoquinone compound, an anthraquinone compound, a squarylium compound, a rylene compound, a phthalocyanine compound, a naphthalocyanine compound, a perylene compound, a nickel-dithiol complex compound, and a derivative thereof.

11. The image sensor of claim 1, wherein the first photoelectronic device and the second photoelectronic device contact each other.

12. An electronic device, comprising the image sensor of claim 1.

* * * * *